United States Patent
Libon et al.

(10) Patent No.: US 9,841,170 B2
(45) Date of Patent: Dec. 12, 2017

(54) LED GRID DEVICE AND A METHOD OF MANUFACTURING A LED GRID DEVICE

(71) Applicant: PHILIPS LIGHTING HOLDING B.V., Eindhoven (NL)

(72) Inventors: Sebastien Paul Rene Libon, Tervuren (BE); Dmitri Anatolievich Chestakov, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 366 days.

(21) Appl. No.: 14/395,099

(22) PCT Filed: Apr. 2, 2013

(86) PCT No.: PCT/IB2013/052619
§ 371 (c)(1),
(2) Date: Oct. 17, 2014

(87) PCT Pub. No.: WO2013/156883
PCT Pub. Date: Oct. 24, 2013

(65) Prior Publication Data
US 2015/0070893 A1    Mar. 12, 2015

Related U.S. Application Data

(60) Provisional application No. 61/635,418, filed on Apr. 19, 2012.

(51) Int. Cl.
*F21V 21/00*    (2006.01)
*F21V 23/00*    (2015.01)
(Continued)

(52) U.S. Cl.
CPC .............. *F21V 23/001* (2013.01); *F21K 9/20* (2016.08); *F21K 9/90* (2013.01); *F21S 4/15* (2016.01);
(Continued)

(58) Field of Classification Search
CPC ...... F21K 9/30; F21K 9/90; F21S 4/15; F21V 23/001; F21V 29/70; F21Y 2105/001;
(Continued)

(56) References Cited

U.S. PATENT DOCUMENTS 6,386,733 B1    5/2002   Ohkohdo et al.
7,360,923 B2 *  4/2008   Weber-Rabsilber ...... G09F 9/33
                                                    362/240

(Continued)

FOREIGN PATENT DOCUMENTS

CN    201936551 U    8/2011
JP    2004119515 A   4/2004
(Continued)

*Primary Examiner* — Elmito Breval
*Assistant Examiner* — Naomi M Wolford

(57) ABSTRACT

A LED grid device comprising a LED grid and a plate-shaped member at which the LED grid has been arranged. The LED grid has several electrically conducting wires arranged side by side, and several LED modules, each LED module having a LED package, wherein each LED package is coupled to at least two wires of the electrically conducting wires. Each LED module further has a thermally conducting element positioned between two adjacent wires of the wires that the LED package is coupled to. The thermally conducting element carries the LED package, and protrudes from the LED package, and the thermally conducting element is attached to the plate-shaped member.

11 Claims, 5 Drawing Sheets

(51) Int. Cl.
  *H05K 7/20*      (2006.01)
  *F21K 9/90*      (2016.01)
  *F21S 4/15*      (2016.01)
  *F21V 29/70*     (2015.01)
  *F21K 9/20*      (2016.01)
  *H01L 33/48*     (2010.01)
  *H01L 33/62*     (2010.01)
  *F21Y 105/10*    (2016.01)
  *F21Y 115/10*    (2016.01)

(52) U.S. Cl.
  CPC ......... *F21V 29/70* (2015.01); *H05K 7/20509* (2013.01); *F21Y 2105/10* (2016.08); *F21Y 2115/10* (2016.08); *H01L 33/486* (2013.01); *H01L 33/62* (2013.01); *H01L 2924/0002* (2013.01)

(58) Field of Classification Search
  CPC ... H05K 7/20509; H01L 33/486; H01L 33/62; H01L 2924/00; H01L 2924/0002
  USPC ............................................ 362/249; 438/28
  See application file for complete search history.

(56) References Cited

U.S. PATENT DOCUMENTS

| | | | |
|---|---|---|---|
| 7,902,568 B2* | 3/2011 | Morikawa | F21K 9/00 257/100 |
| 7,942,551 B2 | 5/2011 | Weekamp et al. | |
| 2002/0122616 A1 | 9/2002 | Bruns | |
| 2009/0092932 A1 | 4/2009 | Hagiwara | |
| 2011/0205702 A1* | 8/2011 | Grajcar | H05K 1/0204 361/692 |

FOREIGN PATENT DOCUMENTS

| | | |
|---|---|---|
| JP | 2006093470 A | 4/2006 |
| JP | 2007095797 A | 4/2007 |
| JP | 2007116078 A | 5/2007 |
| JP | 2007165791 A | 6/2007 |
| JP | 2008172178 A | 7/2008 |
| JP | 2008235493 A | 10/2008 |
| JP | 2009105026 A | 5/2009 |
| WO | 9113425 A1 | 9/1991 |
| WO | 2010002709 A1 | 1/2010 |
| WO | 2010080561 A1 | 7/2010 |

* cited by examiner

LED GRID DEVICE AND A METHOD OF MANUFACTURING A LED GRID DEVICE

CROSS-REFERENCE TO PRIOR APPLICATIONS

This application is the U.S. National Phase application under 35 U.S.C. §371 of International Application No. PCT/IB2013/052619 filed on Apr. 02, 2013, which claims the benefit of U.S. Provisional Patent Application No. 61/635,418, filed on Apr. 19, 2012. These applications are hereby incorporated by reference herein.

FIELD OF THE INVENTION

The present invention relates to a LED grid device and a method of manufacturing a LED grid device.

BACKGROUND OF THE INVENTION

Generally, LED grids are manufactured by joining several rows of LED modules with a set of several parallel wires, where the set of wires has a first width, and then stretching the set of wires to a larger width, thereby forming a grid. One example of such a prior art LED grid is disclosed in U.S. Pat. No. 7,942,551.

The LED grid is typically arranged on or very close to a plate of some material or sandwiched between two plates, at least one thereof being light transmissive, and thereby a LED grid device is formed. A main issue with LEDs is heat extraction. The efficiency of the LEDs is dependent on their temperature. In a LED grid most of the heat is extracted through the wires. This limits the power that can be applied to the LEDs, in particular when the LED grid is arranged on a plate or between two plates.

SUMMARY OF THE INVENTION

It is an object of the present invention to provide a LED grid device and a method for manufacturing a LED grid device that alleviate the above-mentioned problems of the prior art, and allow feeding higher power to the LEDs than in the prior art LED grids.

The invention is based on the insight that it is possible and efficient to add a cooling element to the LED package.

In a first aspect of the present invention, the object is achieved by a LED grid device comprising a LED grid arranged on a plate-shaped member, wherein the LED grid comprises a plurality of electrically conducting wires arranged side-by-side and a plurality of LED modules, each LED module comprising a LED package coupled to at least two wires of the electrically conducting wires, and a thermally conducting element positioned between two adjacent wires of the wires that the LED package is coupled to, wherein the thermally conducting element carries the LED package, and protrudes from the LED package, and wherein the thermally conducting element is attached to the plate-shaped member. Thereby there is provided an additional element, which operates as a heat sink.

In accordance with an embodiment of the LED grid device, each thermally conducting element comprises an intermediate portion, which carries the LED package, and first and second protrusions, which protrude from the intermediate portion in opposite directions. This embodiment provides for an enhanced support of the LED modules.

In accordance with an embodiment of the LED grid device, each thermally conducting element is strip shaped and flat, at least at the side attached to the LED package. One side of the thermally conducting element is attached to the LED package, and an opposite side of the thermally conducting element faces the plate-shaped member.

In accordance with an embodiment of the LED grid device, at least a first portion of each one of the first and second protrusions of each thermally conducting element extends at an angle to the intermediate portion. Thereby flexible mounting conditions are obtained.

In accordance with an embodiment of the LED grid device, said at least a first portion of each one of the first and second protrusions extends in the plate-shaped member. In other words at least a part of each protrusion has been inserted into the plate-shaped member. This is an advantageous way of mounting the LED grid at the plate-shaped member.

In accordance with an embodiment of the LED grid device, a second portion of each one of the first and second protrusions of each thermally conducting element protrudes from the plate-shaped member at an opposite side of the plate-shaped member relative to the side on which the intermediate portion is placed. This embodiment is useful for conducting the heat to an outside of the plate-shaped member, in particular if the plate-shaped member is made from an isolating material.

In accordance with an embodiment of the LED grid device, the at least a first portion of each one of the first and second protrusions of each thermally conducting element extends past the LED package. An end portion of each one of the first and second protrusions of each thermally conducting element extends in parallel with the intermediate portion and is attached to a surface of the plate-shaped member, wherein a light emitting surface of the LED package faces said surface of the plate-shaped member. This embodiment provides a simple way of controlling the distance from the LED to the plate-shaped member, which in this case typically is light transmissive.

In a second aspect of the present invention, the object is achieved by a method of manufacturing a LED grid device comprising the steps of arranging several electrically conducting wires side by side, thereby forming a set of wires having a first width; coupling several LED packages to the set of wires such that each LED package is coupled to at least two wires of the set of wires, and such that several parallel series of LED packages are formed; attaching a respective thermally conducting ribbon to the LED packages of each series; trimming each ribbon to form a separate thermally conducting element for each LED package; stretching the set of wires to a second width, which is larger than the first width; and mounting the set of wires on a plate-shaped member, and attaching each thermally conducting element to the plate-shaped member.

The object of the invention set forth above is obtained by the method as well. Embodiments of the method provide advantages corresponding to those set forth above in conjunction with embodiments of the LED grid device.

These and other aspects, and advantages of the invention will be apparent from and elucidated with reference to the embodiments described hereinafter.

BRIEF DESCRIPTION OF THE DRAWINGS

The invention will now be described in more detail and with reference to the appended drawings in which.

DETAILED DESCRIPTION OF THE EMBODIMENTS

Figure 1A:
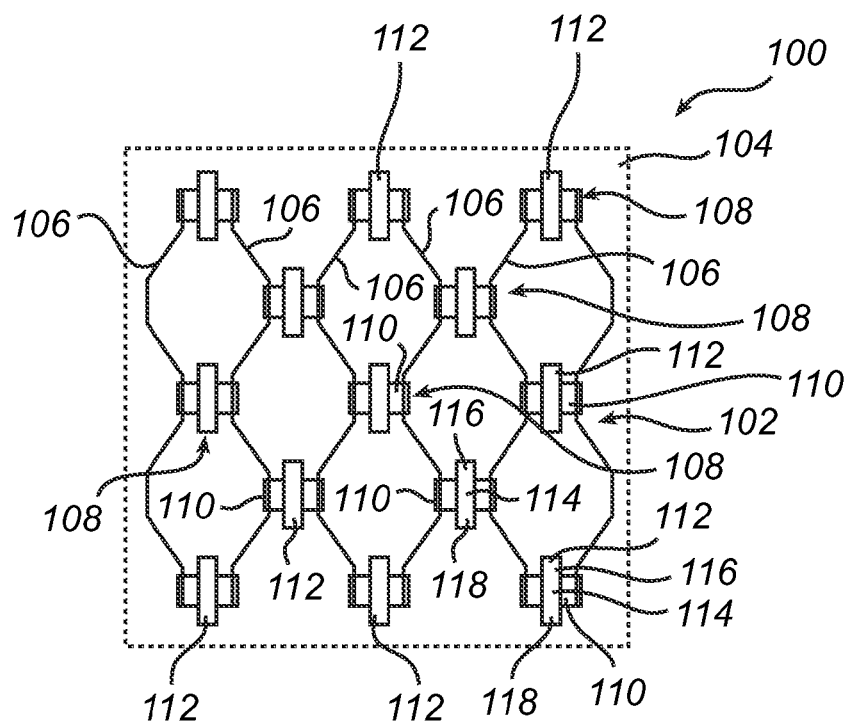
FIGS. 1a and 1b schematically show a first embodiment of a LED grid device according to the present invention.
Figure 1B:
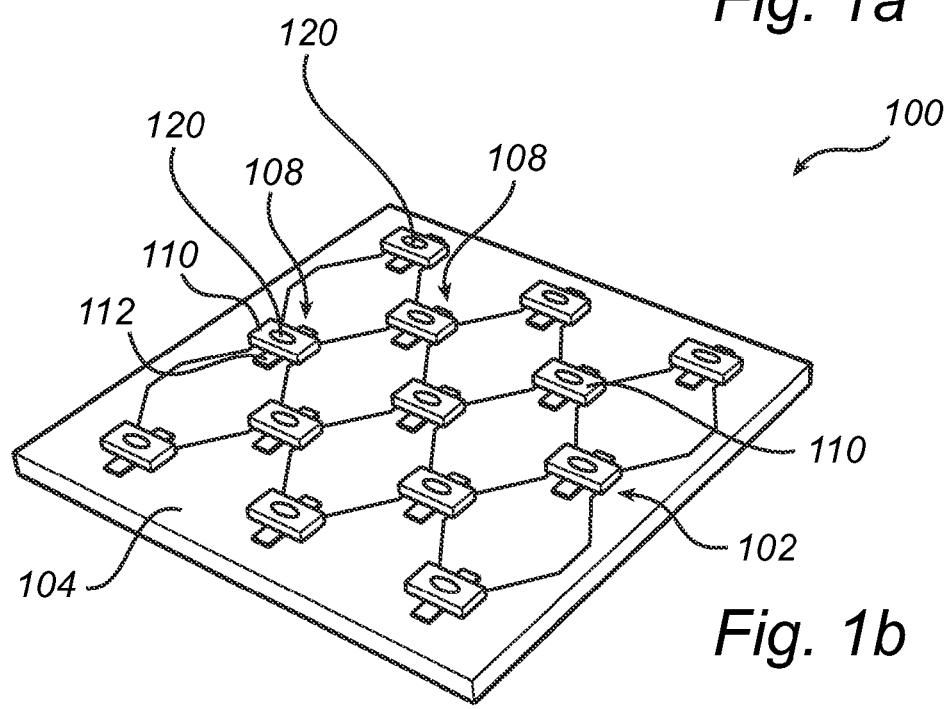

Referring to FIGS. 1a and 1b, a first embodiment of the LED grid device 100 of the present invention comprises a LED grid 102, and a plate-shaped member 104 to which the LED grid 102 has been attached. In this embodiment the plate-shaped member 104 is a bottom plate of the LED grid device 100. In Figure 1a the LED grid device 100 is shown from below, i.e. from the side of the plate-shaped element 104, which has however merely been indicated by a broken rectangle. FIG. 1b is a perspective view from obliquely above. The LED grid 102 comprises several electrically conducting wires 106 arranged side by side, and several LED modules 108. Each LED module comprises a LED package 110, wherein each LED package 110 is coupled to at least two wires 106 of the electrically conducting wires 106. Each LED module further comprises a thermally conducting element 112 positioned between two adjacent wires 106 of the wires that the LED package 110 is attached to. The thermally conducting element 112 carries the LED package, and is attached to the plate-shaped member 104. The thermally conducting element 112 protrudes from the LED package 112. More particularly, in this embodiment the thermally conducting element 112 is strip shaped and flat, and it has an intermediate portion 114, which carries the LED package 110, and first and second protrusions 116, 118, which protrude from the intermediate portion 114 in opposite directions. The very light emitting surface 120 is provided at a top side of the LED package 110, while the thermally conducting element 112 is attached to a bottom side of the LED package 110. Optionally, an additional plate-shaped member, typically having optical properties, is arranged on top of the LED modules 108, and in parallel with and opposite to the plate-shaped member 104 forming the bottom of the LED grid device 100.

The thermally conducting elements 112 are electrically insulated and they have been attached to the plate-shaped member 104 by means of an appropriate attachment method, which may depend on the material of the plate-shaped member 104. For instance the thermally conducting elements 112 are attached to the plate-shaped member 104 by means of e.g. an adhesive, and to the LED packages 110 by means of a solder joint, a thermal glue or any thermally efficient interconnection. The thermally conducting elements 112 substantially increase the surface area of the LED module 108 and substantially increase the heat dissipation to the surroundings. Preferably, the plate-shaped member 104 is thermally conductive as well, but this is not necessary.

Figure 2A:
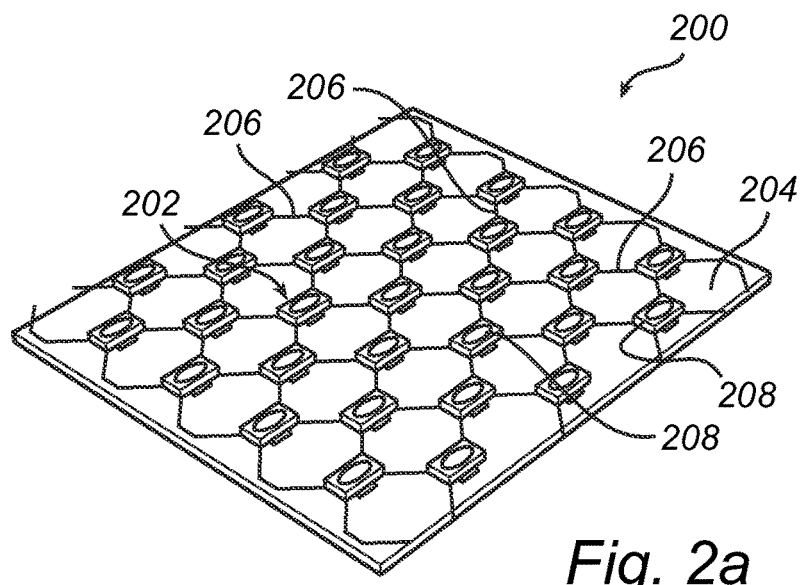
FIGS. 2a to 2c schematically show a second embodiment of the LED grid device.
Figure 2B:
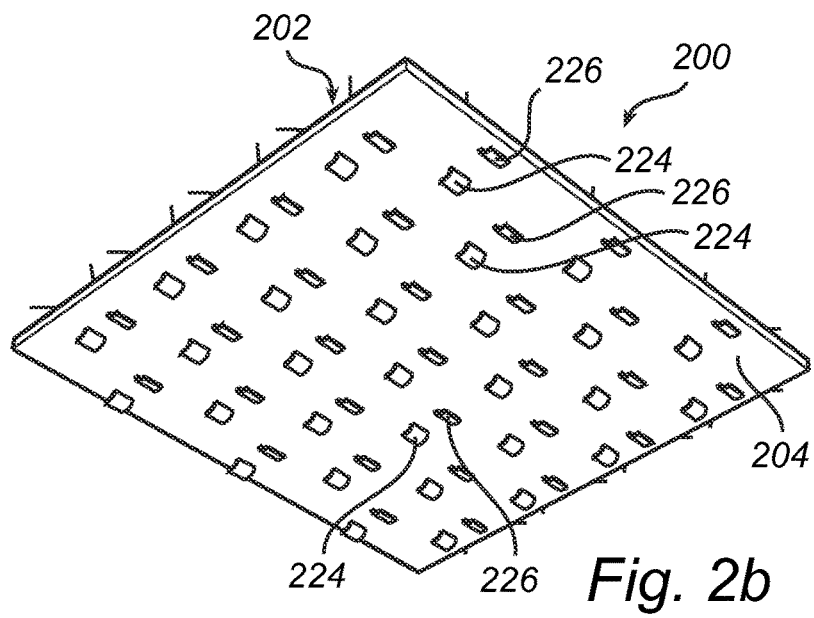
Figure 2C:
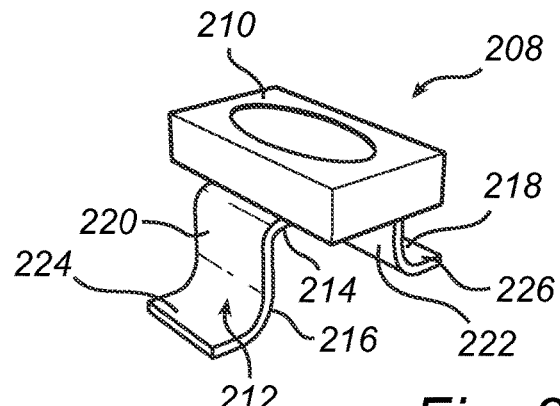

FIGS. 2a to 2c show a second embodiment, which is similar to the first embodiment in most respects. Thus, the second embodiment of the LED grid device 200 comprises a LED grid 202, and a plate-shaped member 204, forming a bottom plate, to which the LED grid 202 has been attached. The LED grid 202 comprises several electrically conducting wires 206 arranged side by side, and several LED modules 208, each comprising a LED package 210 coupled to the wires 206, and a thermally conducting element 212 positioned between two adjacent wires 206. The thermally conducting element 212 carries the LED package 210, and is attached to the plate-shaped member 204. The thermally conducting element has an intermediate portion 214, and first and second protrusions 216, 218.

However, the shape and attachment of the thermally conducting element 212 differs from the first embodiment. Each protrusion can be regarded to have a first portion 220, 222, which extends from the intermediate portion 214, and a second portion 224, 226, which is an end portion and extends from the first portion 220, 222. The thermally conducting element 212 has been bent such that the first portion 220, 222 of each one of the first and second protrusions 216, 218 extends at an angle to the intermediate portion 214. More particularly the angle is about 90 degrees. The second portion 224, 226 extends approximately in parallel with the intermediate portion 214. The first portion 220, 222 of each one of the first and second protrusions 216, 218 extends in the plate-shaped member 204, and the second portions 224, 226 protrude from the plate-shaped member 204 at an opposite side of the plate-shaped member 204 relative to the side on which the intermediate portion 214 is placed, i.e. on a rear side or bottom side of the plate-shaped member 204. Alternatively, the second portions 224, 226 are not bent relative to the first portions 220, 222 but extend in parallel with the first portions 220, 222. That is, the thermally conducting element 212 is staple shaped.

The second embodiment of the LED grid device 200 is particularly useful when the plate-shaped member 204 is thermally isolative, wherein the generated heat is transported along the thermally conducting element 212 through the plate-shaped member 204 and given off to the surroundings at the rear side thereof.

The bent end portions 224, 226 ensure that the LED modules 208 are well anchored at the plate-shaped member 204 and make it unnecessary to use an adhesive. However, depending on the material of the plate-shaped member 204 the LED modules 208 can be well attached with the staple shaped thermally conducting element as well.

Figure 3A:
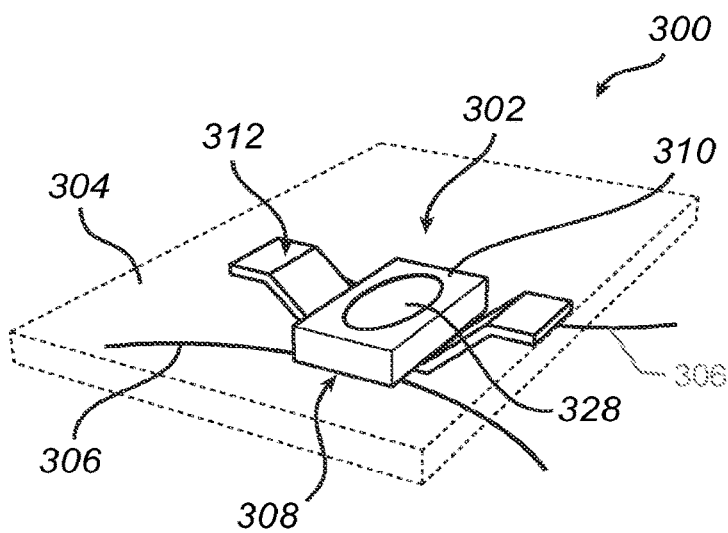
FIGS. 3a and 3b schematically show a part of a third embodiment of the LED grid device.
Figure 3B:
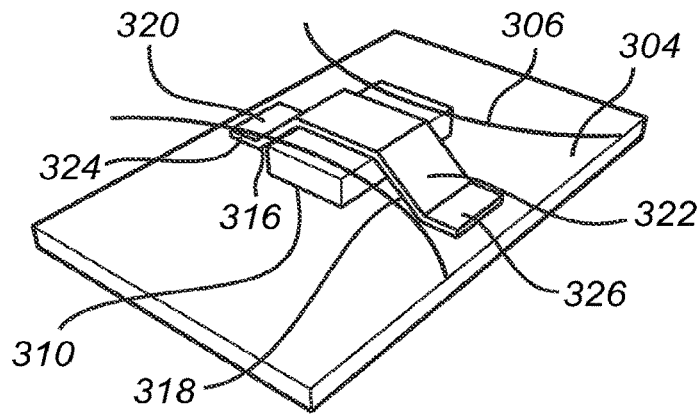
Figure 3C:
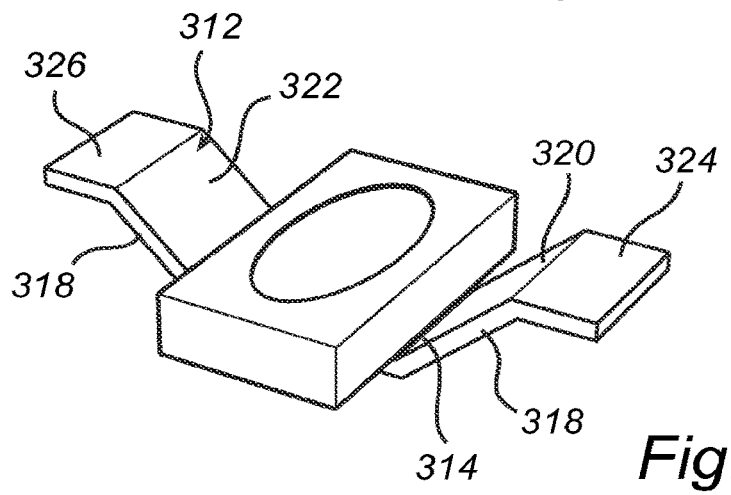

Referring to FIGS. 3a and 3b a third embodiment of the LED grid device 300, which share many features with the first and second embodiments, comprises a LED grid 302, and a plate-shaped member 304, to which the LED grid 302 has been attached. However, in this embodiment the plate-shaped member 304 is a top plate, as will be further described below. The LED grid 302 comprises several electrically conducting wires 306 arranged side by side, and several LED modules 308, each comprising a LED package 310 coupled to the wires 306, and a thermally conducting element 312 positioned between two adjacent wires 306. However, for reasons of simplicity only one LED module 308 is shown. The thermally conducting element 312 carries the LED package 310, and is attached to the plate-shaped member 304. The thermally conducting element 312 has an intermediate portion 314, and first and second protrusions 316, 318.

Similar to the second embodiment, each protrusion has a first portion 320, 322, extending at an angle to the intermediate portion 314, and a second portion, which is an end portion, 324, 326, extending in parallel with the intermediate portion. However, preferably the angle is less than 90 degrees and each one of the first portions 320, 322 extends past the LED package 310. The end portion 324, 326 of each one of the first and second protrusions 316, 318 extends in parallel with the intermediate portion 314 and is attached to a bottom surface of the plate-shaped member 304, wherein a light emitting surface 328 of the LED package 310 faces the bottom surface of the plate-shaped member 304. In other words, the thermally conducting element 312 works like a cup, where the LED module 308 is arranged at the bottom of the cup, and the plate-shaped member 304 is a lid of the cup. In this third embodiment the plate-shaped member 304 is light transmissive and optical, such as simply transparent or more typically diffusive. However, alternatively, the plate-shaped member 304 can be reflective such that the light exits in the opposite direction.

The thermally conducting element 312 can be provided with a light reflective top surface, thus reflecting light towards the plate-shaped member 304.

Figure 4:
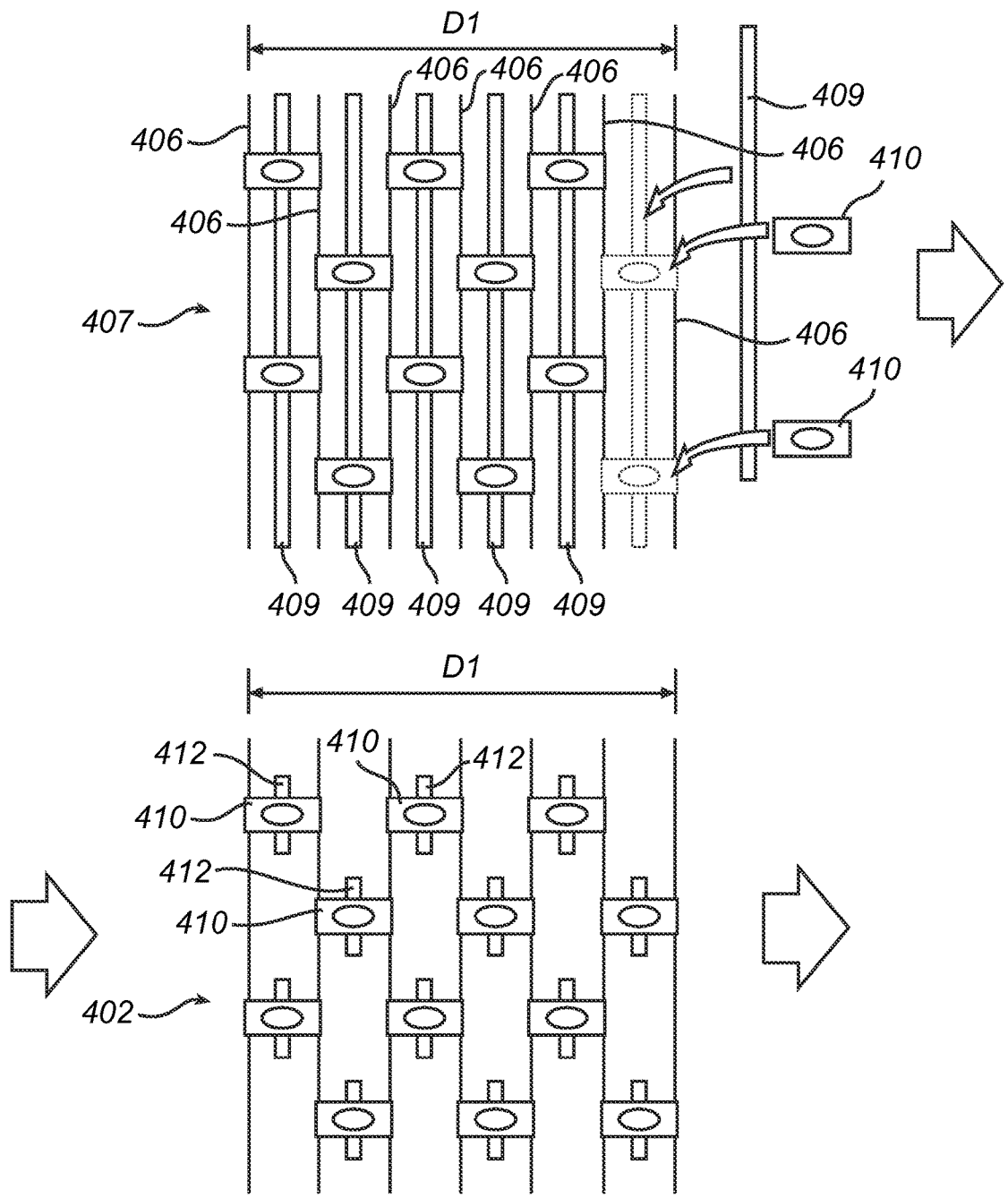
FIG. 4 schematically illustrates an embodiment of a method of manufacturing a LED grid device according to the present invention.
Figure 4:
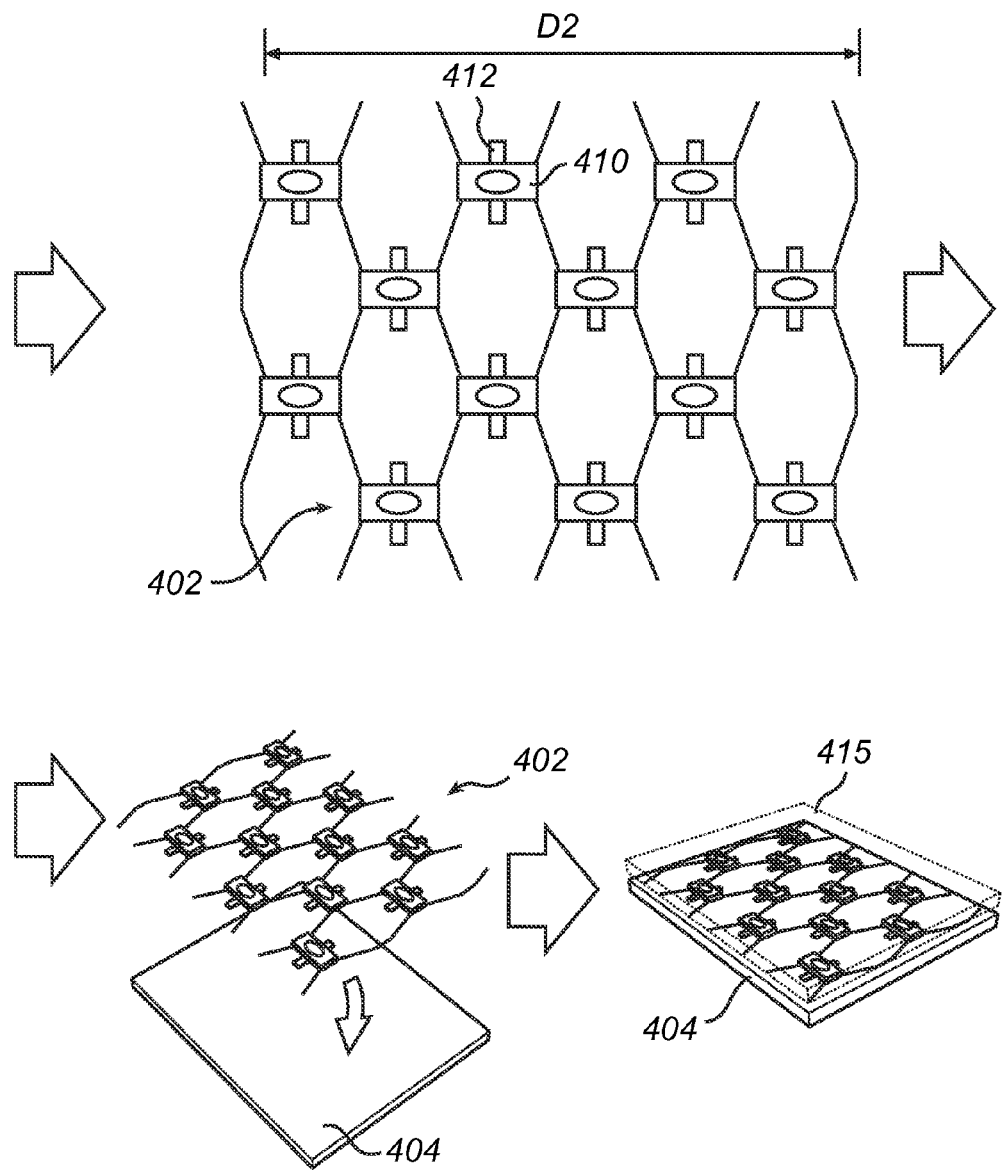

Referring to FIG. 4, an embodiment of a method of manufacturing a LED grid device is shown by a series of images showing subsequent steps of the manufacturing process. The method comprises arranging several electrically conducting wires 406 side by side, thereby forming a set of wires 407 having a first width D1; coupling several LED packages 410 to the set of wires 407 such that each LED package 410 is coupled to at least two wires 406 of the set of wires 407, and such that several parallel series of LED packages 410 are formed; and providing each LED package with a thermally conducting element 412, thereby obtaining a LED grid 402. It should be noted that these steps can be performed in the order that they appear here, and in different orders depending on how the assembly is done. For instance, the LED packages can be positioned in a fixture, and the wires 406 and the thermally conducting elements 412 are provided.

The method further comprises stretching the LED grid 402 to a second width D2, where D2 is larger than D1; and mounting the LED grid 402 on a plate-shaped member 404, including attaching each thermally conducting element 412 to the plate-shaped member 404. Thereby a LED grid device 400 has been produced.

The operation of providing each LED package 410 with a thermally conducting element 412, comprises attaching a respective thermally conducting ribbon 409 to the LED packages 410 of each series; and trimming each ribbon 409 to form a separate thermally conducting element 412 for each LED package 410. Alternatively, but less preferred, the thermally conducting elements 412 are pre-trimmed and attached separately to the LED packages 410. Furthermore, as an alternative, first the wires 406 are arranged side by side, then the thermally conducting ribbons 409 are positioned between the wires 406, and then the LED packages 410 are mounted on the wires and on the thermally conducting ribbons 409. As a further alternative, the LED packages are positioned in a fixture, bottom up, and then the thermally conductive ribbons 409 are mounted on the LED packages, and finally the wires 406 are mounted on the LED packages. The different alternatives provide for different advantages.

As regards the positioning of the LED packages 410, they are arranged such that they are distributed at regular intervals after the stretching, and such that, in a direction perpendicular to the length direction of the wires 406, the stretched LED grid 402 comprises at least one row of LED packages 410 bridging every second gap between adjacent wires 406.

When the thermally conducting ribbons 409 are trimmed, first and second protrusions are left on each thermally conducting element 412, wherein the protrusions protrude from an intermediate portion of the thermally conducting element, which intermediate portion carries the LED package 410.

Each thermally conducting element 412 is formed to a predetermined shape, which means that at least one of the protrusions is formed. In order to arrive at the second embodiment of the LED grid device 200 described above, the first and second protrusions 216, 218 are bent to extend at an angle to the intermediate portion 214, typically a right angle. When mounting the LED grid 402 on the plate-shaped member 404, each thermally conducting element 412 is driven through the plate 404 to protrude from the plate 404 on the rear side of the plate 404. At that rear side of the plate 404, an end portion 224, 226 of each protrusion 216, 218 is bent relative to the rest of the protrusion 216, 218 to secure the mounting of the set of wires 407.

In order to arrive at the third embodiment of the LED grid device 300, each protrusion 316, 318 of the thermally conducting elements 412 is bent to extend at an angle to the intermediate portion 314 past the LED package 410; and an end portion of each protrusion 316, 318 is bent to extend in parallel with the intermediate portion 314. These end portions are attached to a rear side of the plate 404, such as by means of an adhesive or a solder.

In order to arrive at the first embodiment of the LED grid device 100, the thermally conducting elements are left flat and simply glued or soldered to a top surface of the plate 404.

Optionally, the LED grid device of any one of the above-mentioned embodiments is further provided with an additional plate-shaped member, which is attached to the LED grid at an opposite side relative to the plate-shaped member.

Above embodiments of the LED grid device and method of manufacturing a LED grid device according to the present invention as defined in the appended claims have been described. These should only be seen as merely non-limiting examples. As understood by the person skilled in the art, many modifications and alternative embodiments are possible within the scope of the invention as defined by the appended claims.

It is to be noted that for the purposes of his application, and in particular with regard to the appended claims, the word "comprising" does not exclude other elements or steps, and the word "a" or "an" does not exclude a plurality, which per se will be evident to a person skilled in the art.

The invention claimed is:

1. A LED grid device comprising a LED grid arranged on a plate-shaped member, wherein the LED grid comprises a plurality of LED modules and a plurality of electrically conducting wires arranged side-by-side for supplying power to the plurality of LED modules, each LED module comprising:

a LED package coupled to at least two wires of the electrically conducting wires, and a thermally conducting element positioned between two adjacent wires of the wires that the LED package is coupled to, wherein the thermally conducting element carries the LED package, and protrudes from the LED package wherein each thermally conducting element comprises an intermediate portion, which carries the LED package, and first and second protrusions, which protrude from the intermediate portion in opposite directions, and wherein the first and second protrusions of each thermally conducting element is attached to the plate-shaped member for mechanically supporting the LED module, wherein at least a first portion of each one of the first and second protrusions of each thermally conducting element extends at an angle to the intermediate portion such that the intermediate portion is not in contact with the plate shaped member.

2. The LED grid device according to claim 1 wherein each thermally conducting element is strip-shaped and flat, and wherein one side of the thermally conducting element is attached to the LED package, and an opposite side of the thermally conducting element faces the plate-shaped member.

3. The LED grid device according to claim 1, wherein the at least a first portion of each one of the first and second protrusions extends in the plate-shaped member.

4. The LED grid device according to claim 1, wherein a second portion of each one of the first and second protrusions of each thermally conducting element protrudes from the plate-shaped member at an opposite side of the plate-shaped member relative to the side on which the intermediate portion is placed.

5. The LED grid device according to claim 1, wherein the at least first portion of each one of the first and second protrusions of each thermally conducting element extends past the LED package, and wherein an end portion of each one of the first and second protrusions of each thermally conducting element extends in parallel with the intermediate portion and is attached to a surface of the plate-shaped member, wherein a light emitting surface of the LED package faces the surface of the plate-shaped member.

6. A method of manufacturing a LED grid device, comprising the steps of:
    arranging a plurality of electrically conducting wires side-by-side, thereby forming a set of wires having a first width;
    coupling several LED packages to the set of wires such that each LED package is coupled to at least two wires of the set of wires, and such that several parallel series of LED packages are formed;
    providing each LED package with a thermally conducting element, thereby forming a LED grid, wherein each thermally conducting element includes first and second protrusions, which protrude in opposite directions from an intermediate portion, which carries the LED package;
    bending at least a first portion of each one of the first and second protrusions to extend at an angle to the intermediate portion;
    stretching the LED grid to a second width, which is larger than the first width; and
    mounting the LED grid on a plate-shaped member, and attaching the first and second protrusions of each thermally conducting element to the plate-shaped member such that the intermediate portion of each thermally conductive elements is not in contact with the plate-shaped member.

7. The method according to claim 6, wherein the step of providing each LED package with the thermally conducting element comprises the steps of:
    attaching a respective thermally conducting ribbon to the LED packages of each series; and
    trimming each ribbon to form a separate thermally conducting element for each LED package.

8. The method according to claim 6, further comprising the step of forming each thermally conducting element to a predetermined shape.

9. The method according to claim 8, wherein the step of forming each thermally conducting element to the predetermined shape comprises the steps of:
    bending at least a first portion of each one of the first and second protrusions to extend at an angle to the intermediate portion past the LED package; and
    bending an end portion of each one of the first and second protrusions of each thermally conducting element to extend in parallel with the intermediate portion;
    wherein the step of attaching each thermally conducting element to the plate-shaped member comprises the step of attaching the end portion to a surface of the plate-shaped member, wherein a light emitting surface of the LED package faces the surface of the plate-shaped member.

10. The method according to claim 6, wherein the step of mounting the LED grid on the plate-shaped member comprises the step of introducing the first portion of each one of the first and second protrusions into the plate-shaped member.

11. The method according to claim 10, wherein the step of forming each thermally conducting element to the predetermined shape comprises the step of performing the introduction of the first portion of each one of the first and second protrusions into the plate-shaped member such that an end portion of each protrusion protrudes from the plate-shaped member at an opposite side of the plate-shaped member relative to the side on which the intermediate portion is placed.

* * * * *